United States Patent
Sun et al.

(10) Patent No.: US 10,424,616 B1
(45) Date of Patent: Sep. 24, 2019

(54) INTEGRATED CIRCUIT DEVICES INCLUDING VERTICAL AND LATERAL HALL ELEMENTS, AND METHODS FOR FABRICATING THE SAME

(71) Applicant: Globalfoundries Singapore Pte. Ltd., Singapore (SG)

(72) Inventors: Yongshun Sun, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/013,715

(22) Filed: Jun. 20, 2018

(51) Int. Cl.
| | |
|---|---|
| *H01L 27/22* | (2006.01) |
| *H01L 43/04* | (2006.01) |
| *G01R 33/02* | (2006.01) |
| *H01L 43/14* | (2006.01) |
| *G01R 33/07* | (2006.01) |
| *H01L 43/06* | (2006.01) |

(52) U.S. Cl.
CPC .......... *H01L 27/22* (2013.01); *G01R 33/0206* (2013.01); *G01R 33/077* (2013.01); *H01L 43/04* (2013.01); *H01L 43/065* (2013.01); *H01L 43/14* (2013.01)

(58) Field of Classification Search
CPC ................. H01L 43/04; H01L 43/14
See application file for complete search history.

(56) References Cited

U.S. PATENT DOCUMENTS

| | | | | |
|---|---|---|---|---|
| 4,673,964 A * | 6/1987 | Popovic | .................. | H01L 27/22 257/427 |
| 4,970,411 A * | 11/1990 | Halg | ....................... | H01L 27/22 257/423 |
| 5,652,445 A * | 7/1997 | Johnson | .................. | G11C 11/16 257/295 |
| 5,872,384 A * | 2/1999 | Gabara | .................... | H01L 27/06 257/421 |
| 6,903,429 B2 * | 6/2005 | Berndt | ................ | H01L 27/1203 257/108 |
| 9,299,919 B1 * | 3/2016 | Lee | ......................... | G01R 33/07 |
| 9,696,390 B2 * | 7/2017 | Zieren | ................ | G01R 33/0206 |
| 2010/0211347 A1 * | 8/2010 | Friedrich | ........... | G01R 33/0023 702/117 |

(Continued)

*Primary Examiner* — Thao P Le
(74) *Attorney, Agent, or Firm* — Lorenz & Kopf, LLP

(57) ABSTRACT

Integrated circuit devices including vertical Hall elements and lateral Hall elements and methods for fabricating integrated circuits are provided. In an exemplary embodiment, an integrated circuit device includes a substrate including a lateral element region and a vertical element region. The integrated circuit device includes a well in the lateral element region and in the vertical element region of the substrate. Further, the integrated circuit device includes an insulating layer disposed over the substrate in the lateral element region, a semiconductor-over-insulator (SOI) semiconductor layer disposed over the insulating layer in the lateral element region, and lateral element conductive taps located in the semiconductor layer, wherein a lateral Hall element is defined in the lateral element region. Also, the integrated circuit device includes vertical element taps located in the well in the vertical element region, wherein a vertical Hall element is defined in the vertical element region.

17 Claims, 4 Drawing Sheets

(56) References Cited

U.S. PATENT DOCUMENTS

| | | | |
|---|---|---|---|
| 2012/0169329 A1* | 7/2012 | Hellwig | G01R 33/07 324/251 |
| 2013/0021026 A1* | 1/2013 | Ausserlechner | G01L 1/12 324/251 |
| 2015/0346289 A1* | 12/2015 | Ausserlechner | G01R 33/07 324/251 |

* cited by examiner

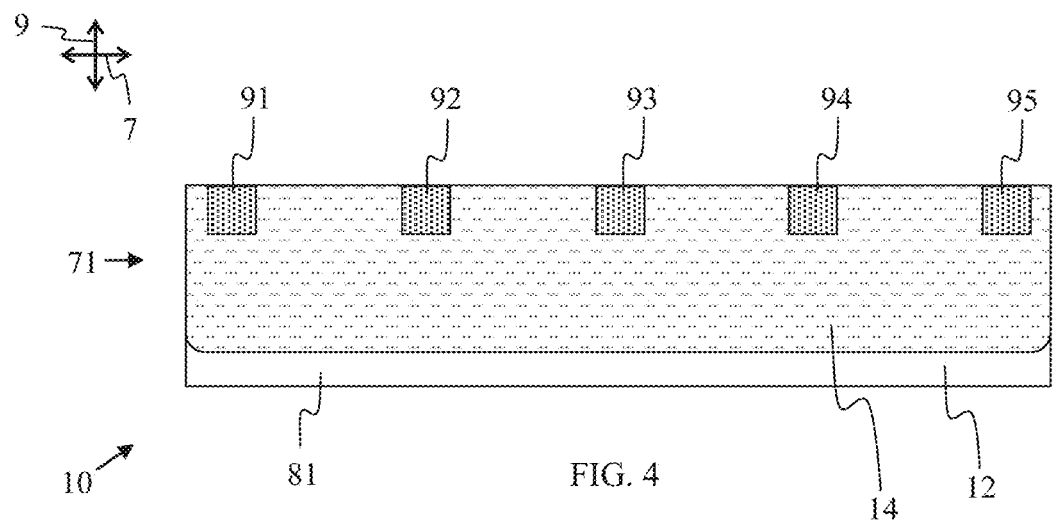
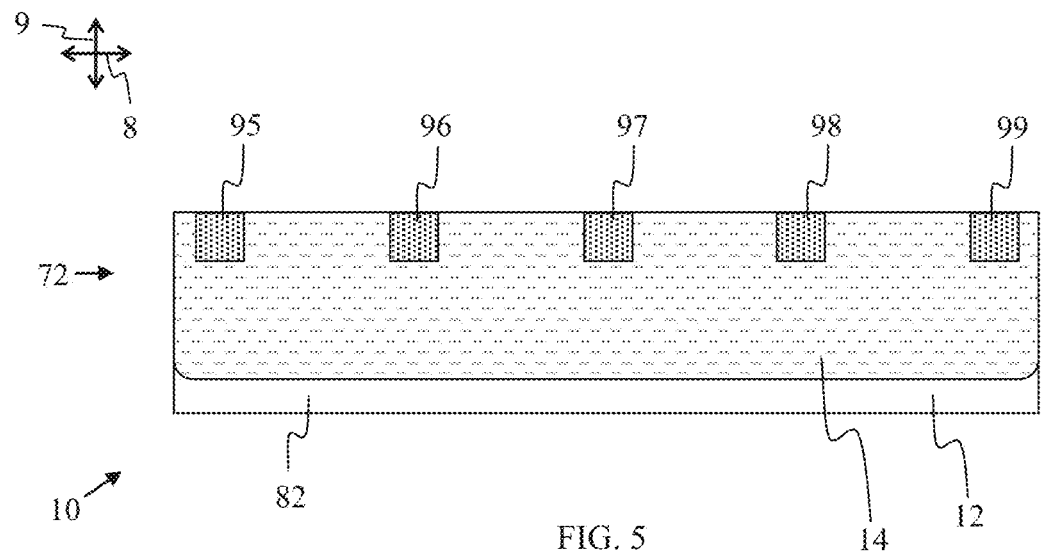

INTEGRATED CIRCUIT DEVICES INCLUDING VERTICAL AND LATERAL HALL ELEMENTS, AND METHODS FOR FABRICATING THE SAME

TECHNICAL FIELD

The technical field generally relates to integrated circuit devices, and more particularly relates to integrated circuit devices including vertical Hall elements and lateral Hall elements.

BACKGROUND

Magnetoelectronics devices incorporate ferromagnetic elements to perform specific functions, such as "latching" data, Boolean operations and similar functions. To detect a result of a Boolean operation, for example, magnetoelectronic devices typically utilize magnetic field sensors to detect the magnetic field induced by the ferromagnetic material.

Magnetic field sensors based on the Hall effect are presently the most widely used magnetic sensor. When a magnetic field is applied perpendicularly to an electric conductor, a voltage is generated transversely to a current flow direction in the electric conductor. This phenomenon is called the Hall effect and the voltage generated is called Hall voltage. Therefore, magnetoelectronic devices typically utilize a Hall sensor or element to sense the orientation of the magnetic field induced by a magnetic element.

Hall sensors are not only used for detecting a magnetic field. Hall sensors also provide signals that can be used for implementing various sensing and control functions. Discrete Hall sensors, coupled with current-excitation and signal-conditioning blocks, provide a voltage output in the presence of a magnetic field. A number of integrated circuit sensors ease the design task by combining Hall sensors and peripheral circuitry to provide linear or switched outputs. The majority of presently-available Hall sensors are low-cost discrete devices. The allure of contactless sensing, low parts cost, and easy design-in make Hall devices the sensors of choice in hundreds of automotive, aircraft, appliance, and tool applications.

Hall sensors may be integrated with semiconductor integrated circuits instead of employing discrete Hall sensor integrated circuits. Such integration allows a system approach thereby improving the sensor performance despite the mediocre characteristics of basic Hall cells.

It is desirable to provide integrated circuit devices with Hall sensors having higher sensitivity to simplify overall system designs, reduce cost, and decrease power consumption. Further, it is desirable to provide Hall sensors on reduced chip area, as compared with conventional processing, to allow for further scaling of devices. Also, it is desirable to facilitate the design and fabrication of Hall sensors over semiconductor-over-insulator (SOI) substrates. Also, it is desirable to provide methods for fabricating such integrated circuits that are cost effective and compatible with logic processing. Furthermore, other desirable features and characteristics will become apparent from the subsequent detailed description and the appended claims, taken in conjunction with the accompanying drawings and this background.

BRIEF SUMMARY

Integrated circuit devices including vertical Hall elements and lateral Hall elements and methods for fabricating integrated circuits are provided. In an exemplary embodiment, an integrated circuit device includes a substrate including a lateral element region and a vertical element region. The integrated circuit device includes a well in the lateral element region and in the vertical element region of the substrate. Further, the integrated circuit device includes an insulating layer disposed over the substrate in the lateral element region, a semiconductor-over-insulator (SOI) semiconductor layer disposed over the insulating layer in the lateral element region, and lateral element conductive taps located in the semiconductor layer, wherein a lateral Hall element is defined in the lateral element region. Also, the integrated circuit device includes vertical element taps located in the well in the vertical element region, wherein a vertical Hall element is defined in the vertical element region.

In another embodiment, an integrated circuit device includes a substrate and a first modular three dimensional sensor, a second modular three dimensional sensor, a third modular three dimensional sensor, and a fourth modular three dimensional sensor. Each modular three dimensional sensor is located in and/or over the substrate. Also, each sensor includes a lateral element region surrounded by an isolation region, a first vertical element region adjacent a first sidewall of the isolation region, and a second vertical element region adjacent a second sidewall of the isolation region. Further, each sensor includes a lateral Hall element in the lateral element region; a first vertical Hall element in the first vertical element region, a second vertical Hall element in the second vertical element region, and a well tap extending from the substrate and through the isolation region.

In yet another exemplary embodiment, a method for fabricating an integrated circuit device is provided. The method includes providing a semiconductor-over-insulator (SOI) structure including a base substrate, an insulating layer overlying the base substrate, and a semiconductor layer overlying the insulating layer. The method further includes doping the base substrate to form a well. Also, the method includes forming an isolation region in the SOI structure to isolate a lateral element region from a vertical element region. The method includes removing the semiconductor layer and the insulating layer from the vertical element region. The method further includes forming vertical element taps in the well in the vertical element region to define a vertical Hall element in the vertical element region. The method also includes forming lateral element conductive taps in the semiconductor layer to define a lateral Hall element in the lateral element region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein:

FIG. 4 is a cross sectional view of a portion of an integrated circuit device of FIGS. 1 and 2 taken along line 4-4 in FIG. 1 according to an embodiment herein;

FIG. 5 is a cross sectional view of a portion of an integrated circuit device of FIGS. 1 and 2 taken along line 5-5 in FIG. 1 according to an embodiment herein.

DETAILED DESCRIPTION

Figure 1:
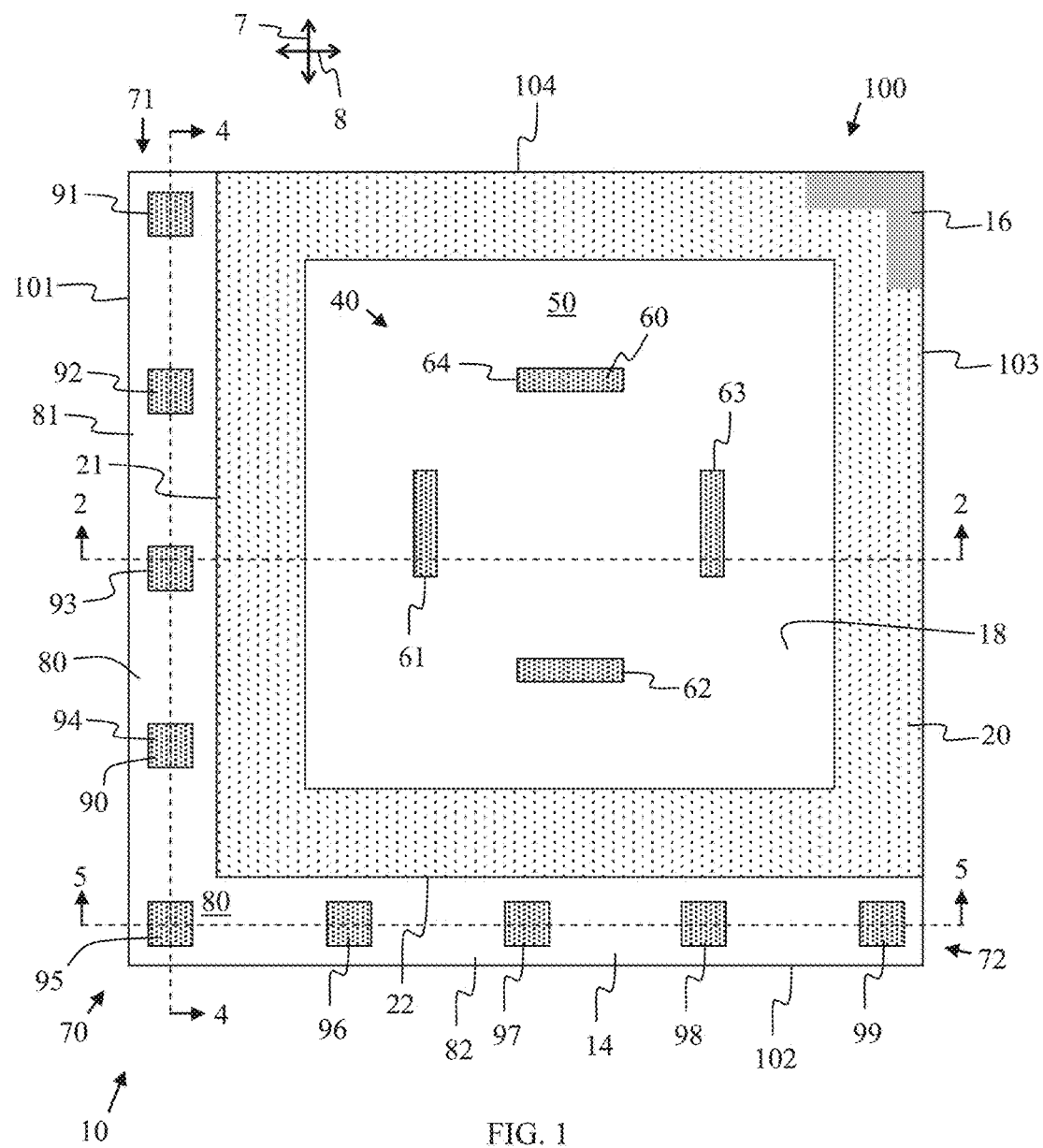
FIG. 1 is an overhead view of an integrated circuit device including vertical and lateral Hall elements according to various embodiments herein.

The following detailed description is merely exemplary in nature and is not intended to limit the integrated circuit devices including vertical and lateral Hall elements or methods for fabricating integrated circuit devices including vertical and lateral Hall elements. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As used herein, it will be understood that when a first element or layer is referred to as being "over" or "under" a second element or layer, the first element or layer may be directly on the second element or layer, or intervening elements or layers may be present. When a first element or layer is referred to as being "on" a second element or layer, the first element or layer is directly on and in contact with the second element or layer. As used herein, a "material layer" is a layer that includes at least 25 wt. % of the identified material. For example, a copper layer is a layer that is at least 25 wt. % copper.

Embodiments of the present disclosure generally relate to integrated circuit devices including vertical and lateral Hall elements. Hall elements or Hall effect elements are transducers that vary output voltages in response to magnetic fields. Hall effect elements may be used for proximity switching, positioning, speed detection, and current sensing applications. As described herein, a modular sensor may be formed with a lateral Hall element and at least one vertical element. Further, multiple modular sensors, such as four modular sensors, may be designed and fabricated adjacent to one another to reduce the amount of chip area used by the Hall effect sensors while provided for cancelling offset voltage.

In FIG. 1, an embodiment of an integrated circuit device 10 formed over a base substrate 12 (shown in FIGS. 2-5), such as a semiconductor substrate, is illustrated. As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. The substrate may further include a plurality of isolation features, such as shallow trench isolation (STI) features or local oxidation of silicon (LOCOS) features. The isolation features may define and isolate the various microelectronic elements, i.e., active regions. Various processes are performed to form the various microelectronic elements including deposition, etching, implantation, photolithography, annealing, or other suitable processes. The microelectronic elements are interconnected to form the integrated circuit device, such as a logic device, memory device, radio frequency (RF) device, input/output (I/O) device, system-on-chip (SoC) device, combinations thereof, or other suitable types of devices.

In an exemplary embodiment, the base substrate 12 is doped with a first conductivity type of conductivity-determining ions. The exemplary substrate 12 may be doped with P-type conductivity-determining ions.

In an embodiment, the integrated circuit device 10 includes a lateral Hall element 40 and at least one vertical Hall element 70. The illustrated embodiment includes two vertical Hall elements 70: a first vertical Hall element 71 and a second vertical Hall element 72; and may be considered to form a three dimensional sensor 100. As described below, an integrated circuit device 10 may include four sensors 100 rotated and aligned as modules to implement a spinning circuit technique to cancel offset voltage.

In the illustrated embodiment, the sensor 100 has a square shape defined by a first perimeter edge 101, a second perimeter edge 102, a third perimeter edge 103 and a fourth perimeter edge 104, though other geometries are possible. As shown, the integrated circuit device 10 includes a lateral element region 50 and a vertical element region 80. In the illustrated embodiment, the lateral element region 50 is square shaped and the vertical element region 80 is L-shaped, though other geometries may be used. The exemplary sensor 100 includes an isolation region 20 that electrically isolates the lateral element region 50 from the vertical element region 80. As shown, a well tap 16 is formed through the isolation region 20. An exemplary well tap 16 extends from the substrate and through the isolation region to the surface of the sensor 100. In an exemplary embodiment, the well tap 16 is a doped region of the base substrate 12. For example, the well tap 16 may be of a first conductivity type or of a second conductivity type, i.e., doped with either P-type or N-type conductivity-determining ions. In an exemplary embodiment, the well tap 16 is doped with P-type conductivity-determining ions. As shown, the exemplary well tap 16 is formed directly adjacent to a corner of the sensor 100, such as the corner formed by the third perimeter edge 103 and the fourth perimeter edge 104. In an exemplary sensor 100, the well tap 16 is isolated from the lateral element region 50 and from the vertical element region 80 by the isolation region 20.

As illustrated in FIG. 1, the lateral Hall element 40 is formed in the lateral element region 50. The lateral Hall element 40 includes lateral element conductive taps 60 disposed in a semiconductor-over-insulator (SOI) semiconductor layer 18. In an exemplary embodiment, the semiconductor layer 18 is lightly doped to achieve high sensitivity. For example, the semiconductor layer 18 may be intrinsically doped, and may have a dopant concentration of less than about 1E15 atoms/cm$^3$. The semiconductor layer 18 may be doped P-type or N-type, as desired. In other embodiments, the semiconductor layer 18 may have higher levels of doping. In the illustrated embodiment, the lateral Hall element 40 includes four lateral element conductive taps 60: conductive tap 61, conductive tap 62, conductive tap 63, and conductive tap 64.

As further illustrated in FIG. 1, the vertical element region 80 includes two portions: a first portion 81 and a second portion 82. In the orientation of FIG. 1, the first portion 81 extends along an axis in the Y direction (identified by arrow 7) from the second perimeter edge 102 to the fourth perimeter edge 104 adjacent the first perimeter edge 101, and the second portion 82 extends along an axis in the X direction (identified by arrow 8) from the first perimeter edge 101 to the third perimeter edge 103 adjacent the second perimeter edge 102. In other words, the first portion 81 is adjacent a first side 21 of the isolation region 20 and the second portion 82 is adjacent a second side 22 of the isolation region 20. In an exemplary embodiment, the first portion 81 and second portion 82 are contiguous. In the illustrated embodiment, the first portion 81 and the second portion 82 overlap at the corner formed by the first perimeter edge 101 and the second perimeter edge 102.

In FIG. 1, the first vertical Hall element 71 is formed in the first portion 81 of the vertical element region 80. The first vertical Hall element 71 includes vertical element conductive taps 90 disposed in a well 14. Exemplary vertical element conductive taps 90 are highly doped regions of the second conductivity type. For example, vertical element conductive taps 90 may be N$^+$-doped. In the illustrated embodiment, the first vertical Hall element 71 includes five vertical element conductive taps 90: conductive tap 91, conductive tap 92, conductive tap 93, conductive tap 94, and conductive tap 95.

Accordingly, the second vertical Hall element 72 is formed in the second portion 82 of the vertical element region 80. The second vertical Hall element 72 also includes vertical element conductive taps 90 disposed in the well 14. Again, exemplary vertical element conductive taps 90 are highly doped regions of the second conductivity type. For example, vertical element conductive taps 90 may be N$^+$-doped. In the illustrated embodiment, the second vertical Hall element 72 includes five vertical element conductive taps 90: conductive tap 95, conductive tap 96, conductive tap 97, conductive tap 98, and conductive tap 99.

As can be seen, conductive tap 95 is shared by the first vertical Hall element 71 and the second vertical Hall element 72 in the area where the first portion 81 and the second portion 82 of the vertical element region 80 overlap. Thus, conductive tap 95 serves as a first vertical element tap and a second vertical element tap.

In the embodiment of FIG. 1, the lateral Hall element 40 is configured to sense a magnetic field in a first direction perpendicular to the SOI layer, i.e., in the direction of the z-axis (perpendicular to the drawing sheet); the first vertical Hall element 71 is configured to sense a magnetic field in a second direction perpendicular to the first direction, i.e., in the direction of the y-axis 7; and the second vertical Hall element 72 is configured to sense a magnetic field in a third direction perpendicular to the first direction and to the second direction, i.e., in the direction of the x-axis 8.

Figure 2:
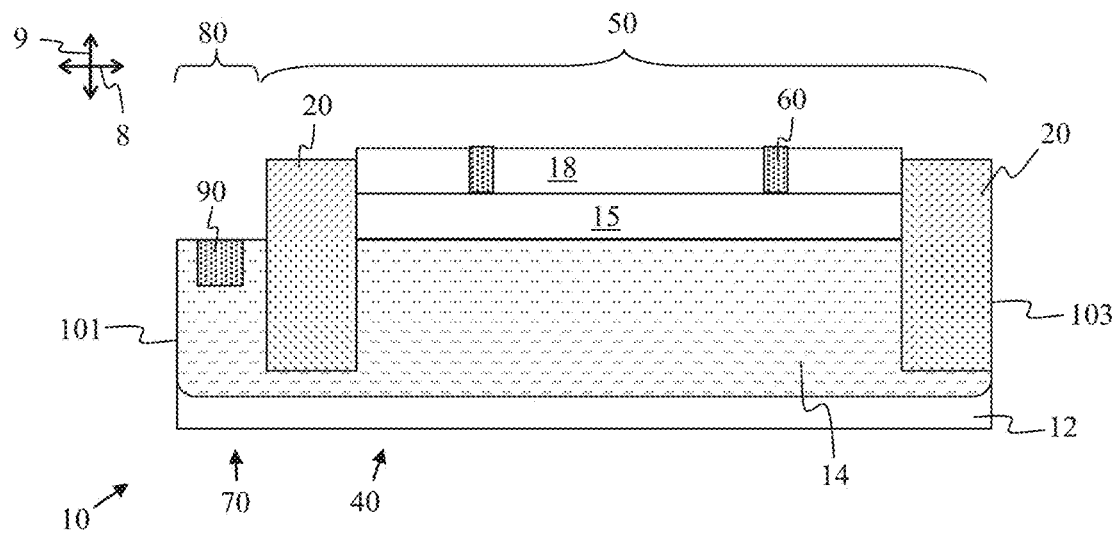
FIG. 2 is a cross sectional view of a portion of an integrated circuit device of FIG. 1 taken along line 2-2 in FIG. 1 according to an embodiment herein.

FIG. 2 provides a cross sectional view of an embodiment of the integrated circuit device 10 of FIG. 1, taken along line 2-2. In FIG. 2, the well 14 is formed in the base substrate 12 across the entirety of the base substrate 12, from first perimeter edge 101 to third perimeter edge 103 and in both the lateral element region 50 and the vertical element region 80. As shown, an insulating layer 15 is disposed over the base substrate 12 in the lateral element region 50. An exemplary insulating layer 15, is a silicon oxide layer often referred to as a buried oxide, or box, layer. An exemplary insulating layer 15 has a thickness of from about 5 nanometers (nm) to about 200 nm, such as about 10 nm.

Overlying the insulating layer 15 in the lateral element region 50 is the semiconductor layer 18. An exemplary semiconductor layer 18 is silicon, though the other semiconductor materials described above in relation to the base substrate 12 may be used. An exemplary semiconductor layer 18 has a thickness of from about 5 nm to about 200 nm, such as about from about 10 to about 20 nm. The sensitivity of the lateral Hall element 40 may be increased as the thickness of the semiconductor layer 18 is reduced. In an exemplary embodiment, the semiconductor layer 18 is doped with the first or second conductivity type. The exemplary isolation region 20 is rectangular, specifically square, prism shape, as shown in FIG. 1, and completely surrounds the insulating layer 15 and the semiconductor layer 18 laterally, i.e., in the lateral plane.

As shown in FIG. 2, the lateral element conductive taps 60 are formed in the semiconductor layer 18 and may extend fully through the semiconductor layer 18 into contact with the insulating layer 15. Further, the vertical element conductive taps 90 are formed in the well 14 in the vertical element region 80. In an exemplary embodiment, the conductive taps 60 and 90 are formed by selectively doping locations of the semiconductor layer 18 and substrate 12, respectively. For example, the lateral element conductive taps 60 and the vertical element conductive taps 90 may independently be heavily doped with the first or second conductivity type.

In FIG. 2, the isolation regions 20 completely surround the lateral element region 50 and isolate the upper region of the well 14 and the semiconductor layer 18, and conductive taps 60 therein, from the vertical element region 80. Likewise the upper area of the well 14 in the vertical element region 80 and the vertical element conductive taps 90 therein are isolated from the lateral element region 50.

In an exemplary embodiment, the base substrate 12 is P-doped, the well 14 is N-doped, the vertical element conductive taps 90 are heavily N-doped (N+-doped), the semiconductor layer 18 is lightly doped N-type (N−-doped), and the lateral element conductive taps 60 are heavily N-doped (N+-doped).

Figure 3:
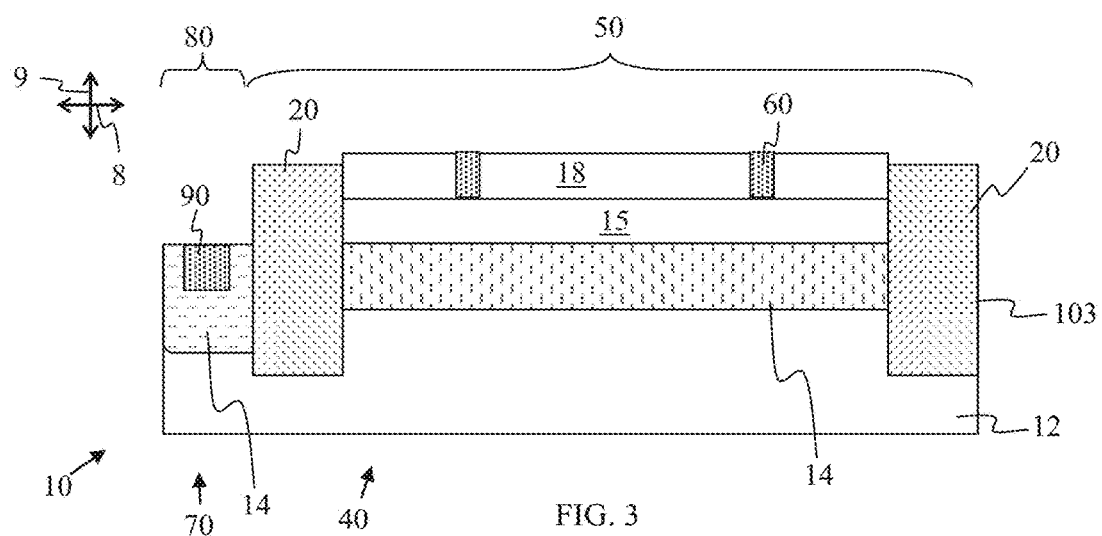
FIG. 3 is a cross sectional view of a portion of an integrated circuit device of FIG. 1 taken along line 2-2 in FIG. 1 according to another embodiment herein.

FIG. 3 provides a cross sectional view of an alternative embodiment of the integrated circuit device 10 of FIG. 1, also taken along line 2-2. In FIG. 3, the structure of the integrated circuit device 10 is substantially the same as the structure of the integrated circuit device 10 of FIG. 2. However, in FIG. 3 the well 14 in the lateral element region 50 is formed separately from the well 14 in the vertical element region 80. For example, the well 14 in the lateral element region 50 may be of the first conductivity type while the well 14 in the vertical element region 80 is of the second conductivity type. In such cases, the wells 14 in each region 50 and 80 are shallower than the isolation regions 20 to provide proper isolation therebetween.

In an exemplary embodiment, the base substrate 12 is P-doped, the well 14 in the vertical element region 80 is N-doped, the vertical element conductive taps 90 are N+-doped, the well 14 in the lateral element region 50 is P-doped, the semiconductor layer 18 is lightly doped N-type (N−-doped), and the lateral element conductive taps 60 are heavily N-doped (N+-doped).

FIGS. 4 and 5 provide a cross sectional views of an embodiment of the integrated circuit device 10 of FIG. 1, taken along line 4-4 and line 5-5, respectively. As shown, the conductive taps 91, 92, 93, 94 and 95 of first vertical Hall element 71 and the conductive taps 95, 96, 97, 98 and 99 of second vertical Hall element 72 are formed in the well 14 in the vertical element region 80. In an exemplary embodiment, the conductive taps 90 are formed by selectively doping locations of the base substrate 12. For example, the vertical element conductive taps 90 may be heavily doped with the first or second conductivity type. Exemplary vertical element conductive taps 90 are heavily N-doped (N+-doped).

Cross referencing FIGS. 1, 2 and 3, the operation of the lateral Hall element 40 may include the application of a constant bias current to flow from conductive tap 61 to conductive tap 63 in the direction of the x-axis 8. A resulting output is measured from conductive tap 64 (Va) to conductive tap 62 (Vb) in the direction of the y-axis 7 and should have a negligible value in the absence of a magnetic field. When the biased lateral Hall element 40 is placed in a magnetic field with flux lines at right angles to the bias current from tap 61 to tap 63 (in the direction of z-axis 9), the voltage output changes in direct proportion to the strength of the magnetic field. A resulting Hall voltage due to a magnetic field in the direction of the z-axis 9 is Vz=Vb−Va.

Cross referencing FIGS. 1 and 4, the operation of the vertical Hall element 71 may include the application of a constant bias current to flow from conductive tap 93 to conductive taps 91 and 95 in the direction of the y-axis 7. A resulting output is measured from conductive tap 92 (Vc) to conductive tap 94 (Vd) in the direction of the y-axis 7 and should have a negligible value in the absence of a magnetic field. When the biased vertical Hall element 71 is placed in a magnetic field with flux lines at right angles to the bias currents from tap 93 to taps 91 and 95 (in the direction of x-axis 8), the voltage output changes in direct proportion to the strength of the magnetic field. A resulting Hall voltage due to a magnetic field in the direction of the x-axis 8 is Vx=Vc−Vd.

Cross referencing FIGS. 1 and 5, the operation of the vertical Hall element 72 may include the application of a constant bias current to flow from conductive tap 97 to conductive taps 95 and 99 in the direction of the x-axis 8. A resulting output is measured from conductive tap 96 (Ve) to conductive tap 98 (Vf) in the direction of the x-axis 8 and should have a negligible value in the absence of a magnetic field. When the biased vertical Hall element 72 is placed in a magnetic field with flux lines at right angles to the bias currents from tap 97 to taps 95 and 99 (in the direction of y-axis 7), the voltage output changes in direct proportion to the strength of the magnetic field. A resulting Hall voltage due to a magnetic field in the direction of the y-axis 7 is Vy=Ve−Vf.

Therefore as described in FIGS. 1-5, sensor 100 is provided with the capability of measuring magnetic fields in three dimensions via lateral Hall element 40, vertical Hall element 71, and vertical Hall element 72. The sensor 100 is formed over a conventional SOI structure including a base substrate 12, an insulating layer 15 and a semiconductor layer 18. A method for fabricating the sensor 100 includes providing an SOI substrate including a base substrate 12, an insulating layer 15 over the base substrate 12, and a semiconductor layer 18 over the insulating layer 15. The method includes forming the isolation regions 20 extending through the semiconductor layer 18, through the insulating layer 15, and into the base substrate 12. The isolation regions 20 may be formed by the well known shallow trench isolation (STI) technique in which trenches are etched and are filled with a dielectric material such as deposited silicon dioxide, and the excess silicon dioxide is removed by CMP. As is well known, there are many processes that can be used to form the isolation regions 20, so the process need not be described here in detail.

The well 14 can be formed, for example, by the ion implantation of N-type or P-type conductivity-determining ions into substrate 12 as desired. For the embodiment of FIG. 3, the well 14 in lateral element region 50 and in vertical element region 80 can be formed with different conductivity type by subsequent application of ion implantation masks and ion implantation processes as is commonly known.

In accordance with an embodiment, the semiconductor layer 18 can be also doped with a desired conductivity type. The semiconductor layer 18 can be doped when formed, i.e., doping may occur during deposition over the insulating layer 15, or semiconductor layer 18 can be doped after formation by ion implantation or the like.

The method for fabricating the sensor 100 includes removing the semiconductor layer 18 and the insulating layer 15 from the vertical element region 80 and from the location of the later-formed well tap 16. This process may be performed using well known masking and lithography processes. The removal of the semiconductor layer 18 and the insulating layer 15 may be aligned with the isolation region 20.

Further, conductive taps 60 and 90 may be formed by selectively doping locations of the semiconductor layer 18 and substrate 12, respectively. Also, the well tap 16 may be formed by selectively doping the base substrate 12, by depositing and selectively doping semiconductor material over the base substrate 12 at the location of the well tap 16, and/or by depositing conductive material over the substrate at the location of the well tap 16.

Figure 6:
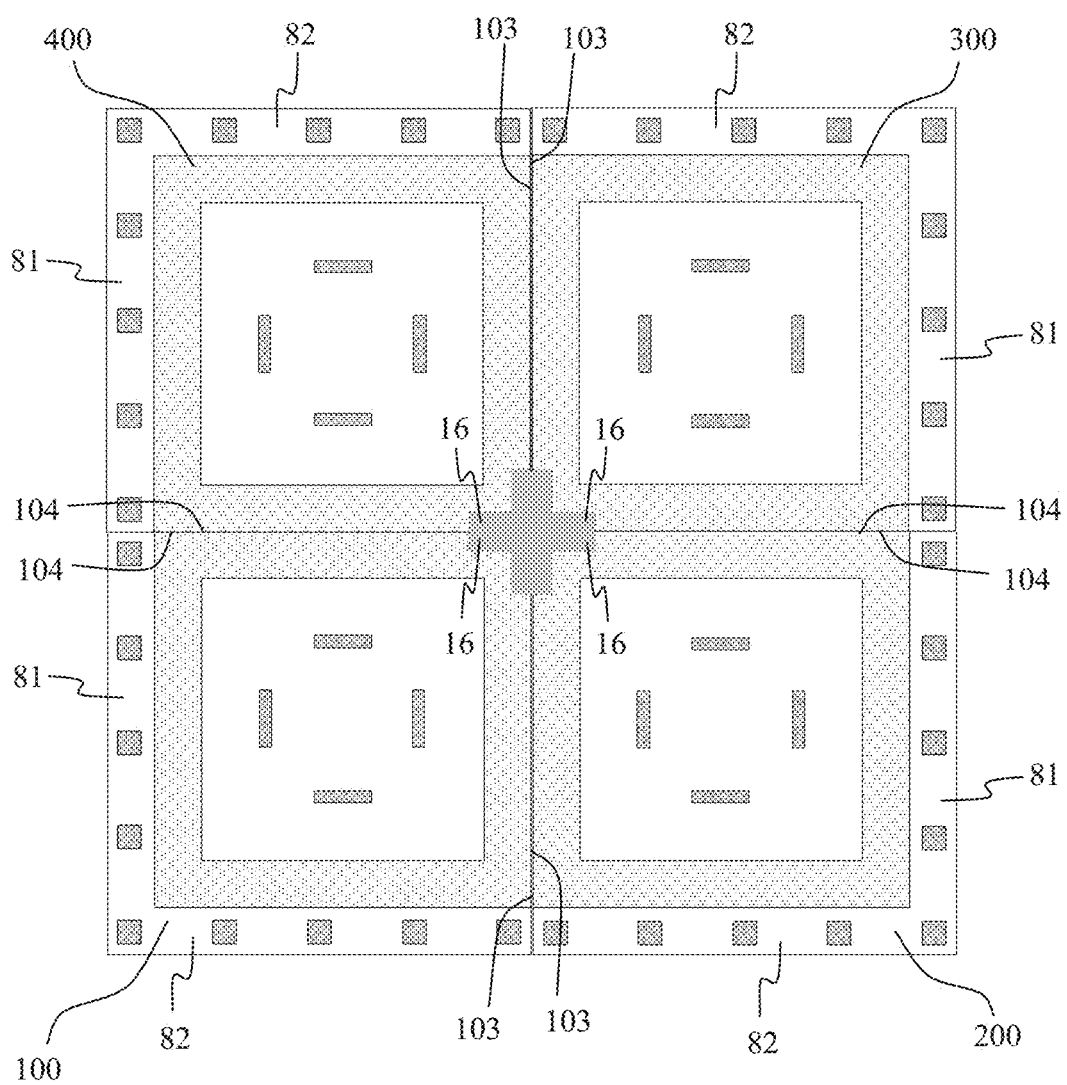
FIG. 6 is an overhead view of an integrated circuit device including four sensors, wherein each sensor includes vertical and lateral Hall elements as shown in FIG. 1, according to various embodiments herein.

Design and fabrication of the integrated circuit device 10 may provide for use of the sensor 100 as a module such that four sensors 100, 200, 300, and 400 may be designed and fabricated adjacent to one another as illustrated in FIG. 6.

In FIG. 6, sensors 100, 200, 300, and 400 are identical to one another, though may be rotated or inverted. Each sensor 100, 200, 300, and 400 may include the features of and be fabricated according to the embodiments of FIGS. 1-5.

As shown, the sensors 100, 200, 300, and 400 are arranged such that the second portion 82 of the vertical element region 80 of the first sensor 100 is collinear with the second portion 82 of the vertical element region 80 of the second sensor 200; the first portion 81 of the vertical element region 80 of the second sensor 200 is collinear with the first portion 81 of the vertical element region 80 of the third sensor 300; the second portion 82 of the vertical element region 80 of the third sensor 300 is collinear with the second portion 82 of the vertical element region 80 of the fourth sensor 400; and the first portion 81 of the vertical element region 80 of the fourth sensor 400 is collinear with the first portion 81 of the vertical element region 80 of the first sensor 100.

Also, as shown, the third sidewall 103 of the first sensor 100 contacts the third sidewall 103 of the second sensor 200; the fourth sidewall 104 of the second sensor 200 contacts the fourth sidewall 104 of the third sensor 300; the third sidewall 103 of the third sensor 300 contacts the third sidewall 103 of the fourth sensor 400; and the fourth sidewall 104 of the fourth sensor 400 contacts the fourth sidewall 104 of the first sensor 100.

Further, the well taps 16 of the sensors 100, 200, 300, and 400 are in direct contact to, and aligned with, each other for applying a same back bias to each modular three dimensional sensor 100, 200, 300, and 400.

With the design and arrangement of the sensors 100, 200, 300 and 400, the embodiment of FIG. 6 provides an integrated circuit device 100 with the capability to cancel voltage offset in a reduced chip area as compared with conventional integrated circuit design.

Additional processes may be performed to complete forming the integrated circuit device 10 of FIG. 1 or 6. Further, the present disclosure may be embodied in other specific forms without departing from the spirit or essential characteristics thereof.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit device comprising:
   a substrate including a lateral element region and a vertical element region;
   a well in the lateral element region and in the vertical element region of the substrate;
   an insulating layer disposed over the substrate in the lateral element region;
   a semiconductor-over-insulator (SOI) semiconductor layer disposed over the insulating layer in the lateral element region;
   lateral element conductive taps located in the semiconductor layer, wherein a lateral Hall element is defined in the lateral element region; and
   vertical element taps located in the well in the vertical element region, wherein a vertical Hall element is defined in the vertical element region.

2. The integrated circuit device of claim 1 wherein:
   the lateral element region is surrounded by an isolation region formed in the substrate;
   the vertical element region includes a first vertical element region adjacent a first side of the isolation region and a second vertical element region adjacent a second side of the isolation region; and
   the vertical Hall element includes a first vertical Hall element defined in the first vertical element region and a second vertical Hall element defined in the second vertical element region.

3. The integrated circuit device of claim 2 wherein:
   the lateral Hall element is configured to sense a magnetic field in a first direction perpendicular to the semiconductor layer;
   the first vertical Hall element is configured to sense a magnetic field in a second direction perpendicular to the first direction; and
   the second vertical Hall element is configured to sense a magnetic field in a third direction perpendicular to the first direction and to the second direction.

4. The integrated circuit device of claim 2 wherein:
   the vertical element taps include first vertical element taps in the first vertical element region and second vertical element taps in the second vertical element region.

5. The integrated circuit device of claim 4 wherein the first vertical element region and the second vertical element region overlap in an overlapping region and one vertical element tap is located in the overlapping region and serves as a first vertical element tap and a second vertical element tap.

6. The integrated circuit device of claim 2 further comprising a well tap extending from the substrate and through the isolation region.

7. The integrated circuit device of claim 1 wherein:
   the substrate is of a first conductivity type; and
   the well in the lateral element region and in the vertical element region is of a second conductivity type.

8. The integrated circuit device of claim 7 wherein the vertical element taps are highly doped regions of the second conductivity type.

9. The integrated circuit device of claim 1 wherein:
   the substrate is of a first conductivity type;
   the well in the lateral element region is of the first conductivity type; and
   the well in the vertical element region is of a second conductivity type.

10. An integrated circuit device comprising:
    a substrate; and
    a first modular three dimensional sensor, a second modular three dimensional sensor, a third modular three dimensional sensor, and a fourth modular three dimensional sensor; wherein each modular three dimensional sensor is located in and/or over the substrate and comprises:
    a lateral element region surrounded by an isolation region;
    a first vertical element region adjacent a first sidewall of the isolation region;
    a second vertical element region adjacent a second sidewall of the isolation region;

a lateral Hall element in the lateral element region;
a first vertical Hall element in the first vertical element region;
a second vertical Hall element in the second vertical element region; and
a well tap extending from the substrate and through the isolation region.

11. The integrated circuit device of claim 10 wherein:
the first vertical element region of the first sensor is collinear with the first vertical element region of the second sensor;
the second vertical element region of the second sensor is collinear with the second vertical element region of the third sensor;
the first vertical element region of the third sensor is collinear with the first vertical element region of the fourth sensor; and
the second vertical element region of the fourth sensor is collinear with the second vertical element region of the first sensor.

12. The integrated circuit device of claim 10 wherein the four well taps are in direct contact with each other for applying a same back bias to each modular three dimensional sensor.

13. The integrated circuit device of claim 10 wherein;
in each modular three dimensional sensor, the isolation region includes the first sidewall, the second sidewall, a third sidewall and a fourth sidewall and completely laterally surrounds the respective lateral element region;
the fourth sidewall of the first sensor contacts the fourth sidewall of the second sensor;
the third sidewall of the second sensor contacts the third sidewall of the third sensor;
the fourth sidewall of the third sensor contacts the fourth sidewall of the fourth sensor; and
the third sidewall of the fourth sensor contacts the third sidewall of the first sensor.

14. The integrated circuit device of claim 10 wherein, in each modular three dimensional sensor, the first vertical Hall element and the second vertical Hall element include vertical element taps in the substrate.

15. The integrated circuit device of claim 14 further comprising a semiconductor-over-insulator (SOI) structure including:
an insulating layer disposed over the substrate in a selected region of each modular three dimensional sensor; and
a semiconductor layer disposed over the insulating layer in each selected region;
wherein, in each modular three dimensional sensor, the lateral Hall element includes lateral element taps formed in the semiconductor layer.

16. The integrated circuit device of claim 15 wherein each modular three dimensional sensor includes an isolation region that isolates the lateral Hall element from the first vertical Hall element and the second vertical Hall element.

17. The integrated circuit device of claim 16 wherein, in each modular three dimensional sensor, the isolation region has a rectangular prism shape and completely surrounds the insulating layer and the semiconductor layer in the respective selected region.

* * * * *